United States Patent
Sung

(10) Patent No.: US 10,109,577 B2
(45) Date of Patent: Oct. 23, 2018

(54) ARRAY SUBSTRATE, LIQUID CRYSTAL DISPLAY PANEL AND DISPLAY APPARATUS

(71) Applicant: BOE TECHNOLOGY GROUP CO., LTD., Beijing (CN)

(72) Inventor: Um Yoon Sung, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/680,489

(22) Filed: Aug. 18, 2017

(65) Prior Publication Data

US 2018/0136526 A1     May 17, 2018

(30) Foreign Application Priority Data

Nov. 11, 2016    (CN) .......................... 2016 1 0994341

(51) Int. Cl.
| | |
|---|---|
| *H01L 29/18* | (2006.01) |
| *H01L 21/00* | (2006.01) |
| *H01L 23/522* | (2006.01) |
| *G02F 1/1335* | (2006.01) |
| *G02F 1/1362* | (2006.01) |

(52) U.S. Cl.
CPC .... *H01L 23/5225* (2013.01); *G02F 1/133512* (2013.01); *G02F 1/136209* (2013.01); *G02F 2001/136218* (2013.01)

(58) Field of Classification Search
CPC .................................................. H01L 23/5225
USPC ......................................... 438/28–35; 257/88
See application file for complete search history.

(56) References Cited

U.S. PATENT DOCUMENTS

| | | | |
|---|---|---|---|
| 9,229,287 B2* | 1/2016 | Choi | G02F 1/134309 257/91 |
| 9,368,520 B2* | 6/2016 | Li | H01L 27/124 257/72 |
| 2017/0199441 A1* | 7/2017 | Um | G02F 1/136286 |
| 2017/0278868 A1* | 9/2017 | Tian | H01L 27/124 |

* cited by examiner

*Primary Examiner* — Calvin Lee
(74) *Attorney, Agent, or Firm* — Kinney & Lange, P.A.

(57) ABSTRACT

An array substrate includes a plurality of gate lines and a plurality of data lines arranged to cross each other, a plurality of pixel electrodes disposed within areas defined by the gate lines and the data lines, and shielding electrodes provided over the gate lines, wherein the shielding electrodes cover at least edge portions of the gate lines close to the pixel electrodes; at least every three pixel electrodes constitute a pixel unit, and at least one pixel electrode in each pixel unit has a length substantially in an extension direction of the gate lines larger than a length thereof substantially in an extension direction of the data lines; the respective pixel electrodes constituting the same pixel unit are connected with different data lines correspondingly; and there are two data lines in a gap between every two adjacent pixel units.

20 Claims, 4 Drawing Sheets

ARRAY SUBSTRATE, LIQUID CRYSTAL DISPLAY PANEL AND DISPLAY APPARATUS

CROSS-REFERENCE TO RELATED APPLICATION

This application claims the benefit of Chinese Patent Application No. 201610994341.4 filed on Nov. 11, 2016 in the State Intellectual Property Office of China, the whole disclosure of which is incorporated herein by reference.

TECHNICAL FIELD

Embodiments of the present disclosure relate to the field of display technology, and in particular to an array substrate, a liquid crystal display (LCD) panel and a display apparatus.

BACKGROUND

In an LCD panel of advanced super dimension switch (ADS) type, an electric field generated at edges of slit electrodes arranged in the same plane and an electric field generated between a slit electrode layer and a plate electrode layer form a multidimensional electric field such that liquid crystal molecules in all orientations between the slit electrodes and right over the electrodes in a liquid crystal cell can be rotated to improve efficiency of liquid crystal and increase light transmittance.

However, when an ADS type LCD panel is compressed forcefully, an opposing substrate disposed above an array substrate is displaced. If a black matrix over a gate line is not wide enough, light leakage easily occurs from a side of the gate line, resulting a poor quality of images in the LCD panel. In prior art systems, typically a shielding electrode is used to shield an electric field above a gate line, such that even if the LCD panel including the array substrate is displaced under effect of an external force, the deflection of the liquid crystal molecules will not be affected and thus light leakage around the gate lines can be eliminated.

On the other hand, in order to avoid light leakage at a data line, typically a black matrix disposed over the data line and covering the data line is made to have a larger width. As a result, although the width of the black matrix over a gate line is reduced by using a shielding electrode, the actual effect of increasing aperture ratio of the LCD panel is limited, and the actual effect of increasing utilization efficiency of liquid crystal is also limited.

For the above reasons, there is still a need to further improve aperture ratio and transmittance of an LCD panel while satisfying gate line shielding.

SUMMARY

According to one aspect of embodiments of the present disclosure, there is provided an array substrate, including a plurality of gate lines and a plurality of data lines arranged to cross each other, a plurality of pixel electrodes disposed within areas defined by the plurality of gate lines and the plurality of data lines, and shielding electrodes disposed above the gate lines, wherein the shielding electrodes cover at least edge portions of the gate lines close to the pixel electrodes, respectively; at least every three pixel electrodes constitute a pixel unit, and at least one pixel electrode in each pixel unit has a length in an extension direction of the gate lines larger than a length thereof in an extension direction of the data lines; the respective pixel electrodes constituting the same pixel unit are connected with different data lines correspondingly; and there are two data lines provided in a gap between every two adjacent pixel units.

In a possible embodiment, the shielding electrodes completely cover the gate lines, respectively.

In a possible embodiment, the shielding electrodes only cover the edge portions of the gate lines, respectively.

In a possible embodiment, the shielding electrodes and the pixel electrodes are disposed in the same layer and insulated from each other.

In a possible embodiment, the shielding electrodes and the pixel electrodes are disposed in the same layer and insulated from each other.

In a possible embodiment, in each pixel unit, there is at least one group of pixel electrodes consisting of two pixel electrodes arranged in the extension direction of the data lines.

In a possible embodiment, each of the two pixel electrodes arranged in the extension direction of the data lines has a length in the extension direction of the gate lines larger than a length thereof in the extension direction of the data lines.

In a possible embodiment, every three pixel electrodes constitute a pixel unit having a rectangular shape, in which two of the every three pixel electrodes are arranged in the extension direction of the data lines, while the remaining one of the every three pixel electrodes and the two of the every three pixel electrodes are arranged in the extension direction of the gate lines.

In a possible embodiment, every four pixel electrodes constitute a pixel unit having a rectangular shape, in which two groups of pixel electrodes are arranged substantially in the extension direction of the gate lines, with each group consisting of two pixel electrodes arranged substantially in the extension direction of the date lines.

In a possible embodiment, the array substrate further includes a black matrix layer disposed over the data lines and the gate lines, wherein a width of a pattern of the black matrix layer over each data line and covering the data line is greater than a width of the data line.

Another aspect of embodiments of the present disclosure provides a liquid crystal display panel including the array substrate according to the abovementioned embodiments of the disclosure, an opposing substrate opposite to the array substrate, and a black matrix layer provided on a side of the opposing substrate facing the array substrate or on a side of the array substrate facing the opposing substrate, wherein a width of a pattern of the black matrix layer over each data line and covering the data line is greater than a width of the data line.

A yet another aspect of embodiments of the present disclosure provides a display apparatus including the liquid crystal display panel according to the abovementioned embodiments of the present disclosure.

BRIEF DESCRIPTION OF THE DRAWINGS

The above and other features of the present disclosure will become more apparent by describing in detail exemplary embodiments thereof with reference to the accompanying drawings, in which.

DETAILED DESCRIPTION OF PREFERRED EMBODIMENTS

Figure 1A:
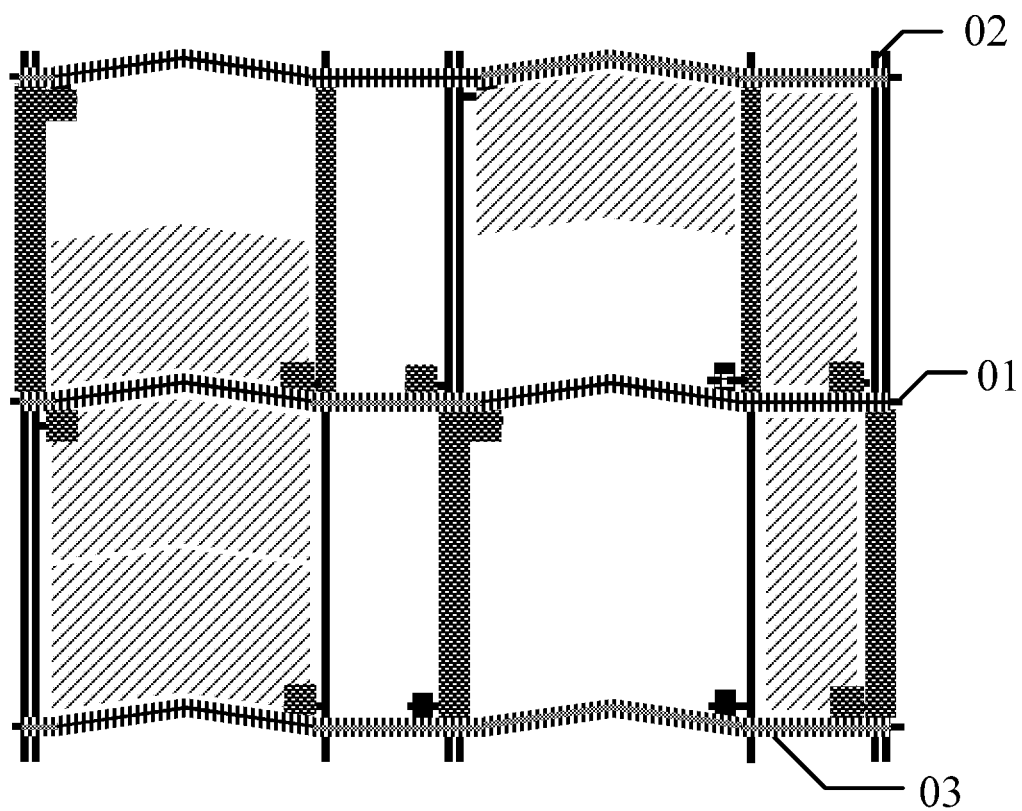
FIG. 1a is a schematic structural view of an array substrate according to an embodiment of the present disclosure.

Embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

Hereinafter, an array substrate, a liquid crystal display (LCD) panel and a display apparatus according to embodiments of the present disclosure will be described in detail with reference to the accompanying drawings.

Figure 1B:
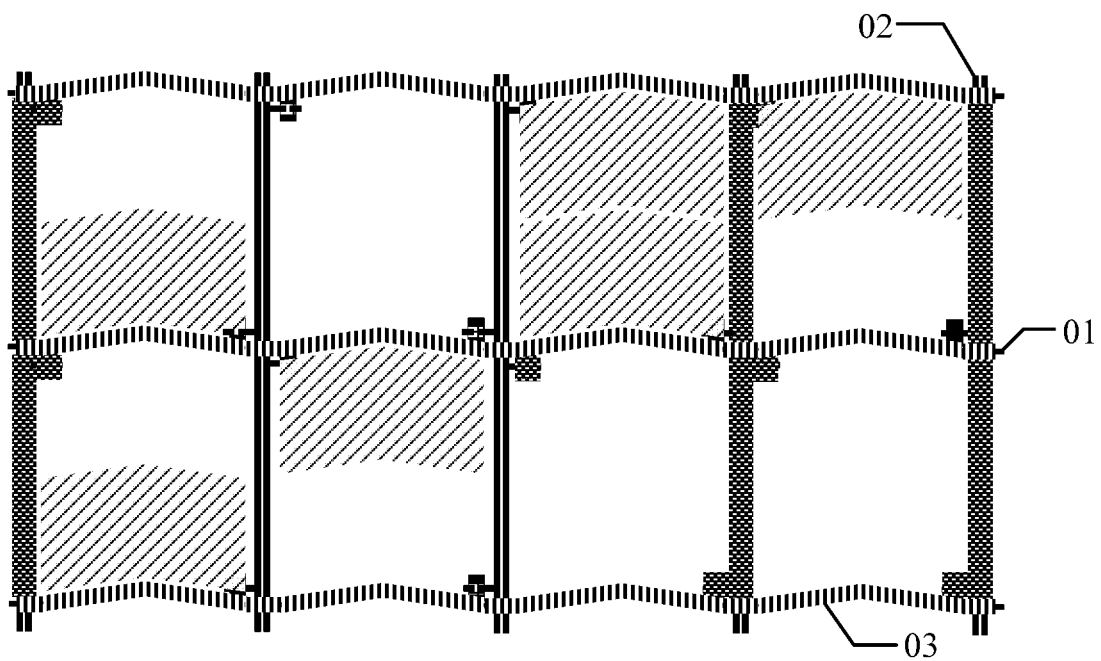
FIG. 1b is a schematic structural view of an array substrate according to another embodiment of the present disclosure.

As shown in FIG. 1a or 1b, an embodiment of the disclosure provides an array substrate including a plurality of gate lines 01 and a plurality of data lines 02 crossing each other, a plurality of pixel electrodes disposed in areas defined by the plurality of gate lines 01 and the plurality of data lines 02, and shielding electrodes 03 disposed over the gate lines 01, respectively. The shielding electrodes 03 at least cover edge portions of the gate lines 01 close to the pixel electrodes, such as pixel electrodes A, B or C in FIG. 1c, or pixel electrodes A', B', C' or D' in FIG. 1d, respectively. At least every three pixel electrodes constitute a pixel unit, and at least one pixel electrode in each pixel unit has a length substantially in an extension direction of the gate lines 01, which is larger than a length of the at least one pixel electrode substantially in an extension direction of the date lines 02. The respective pixel electrodes of each pixel unit are connected with different data lines 02 correspondingly. There are two data lines 02 provided in a gap between every two pixel units adjacent to each other.

With the array substrate according to the embodiment of the disclosure, an area of a black matrix for covering data lines in each pixel unit is greatly reduced and the aperture ratio is increased without reducing the number of the data lines and the gate lines by improving the structure of the data lines by providing two data lines in a gap between every two pixel units adjacent each other. Further, an area of a black matrix covering the gate lines is reduced by shielding the gate lines. The two factors function together to greatly increase the aperture ratio of the LCD panel, and in turn greatly improve the quality of picture of the LCD panel.

In order to realize shielding of the gate lines 01 by the shielding electrodes 03, there are two implementations for the array substrate according to embodiments of the disclosure.

As shown in FIG. 1b, the shielding electrodes 03 simply cover edge portions of the gate lines 01 close to the pixel electrodes, respectively.

Alternatively, as shown in FIG. 1b, the shielding electrodes 03 completely cover the gate lines 01, respectively.

The shielding electrodes 03 simply cover edge portions of the gate lines 01 close to the pixel electrodes, respectively. This means that the orthogonal projections of the shielding electrodes 03 on the substrate simply overlap the edges of the orthogonal projections of the gate lines 01 on the substrate, respectively. A length of the overlapped portion in an extension direction of the data lines 02 may be in the range of 3 um-5 um, or other values, which is not limited herein.

Note that in a structure of an LCD panel consisting of an array substrate and an opposing substrate, for an LCD panel of ADS type, a common electrode layer is disposed on a side of the array substrate; while for an LCD panel of TN type or VA type, a common electrode layer is disposed on a side of the opposing substrate. In order to apply a common electrode signal to the shielding electrode 03 so as to shield the gate lines 01, the array substrate of embodiments of the present disclosure is only adapted to an LCD panel of ADS type, in which the shielding electrodes 03 may be disposed in the same layer as the pixel electrodes and insulated from the pixel electrodes to avoid interference with the signal of the pixel electrodes.

In an array substrate according to a specific embodiment of the disclosure, the structure of the pixel unit may be improved by the following manner.

In each pixel unit, there is at least one group of pixel electrodes that include two pixel electrodes arranged substantially in an extension direction of the data lines 02.

In order to avoid defects caused because the pixel electrode is distanced from the data line 02 or the gate line 01 around it with different spaces, the spaces between each pixel electrode and the surrounding data lines or gate lines are always kept the same.

Figure 1C:
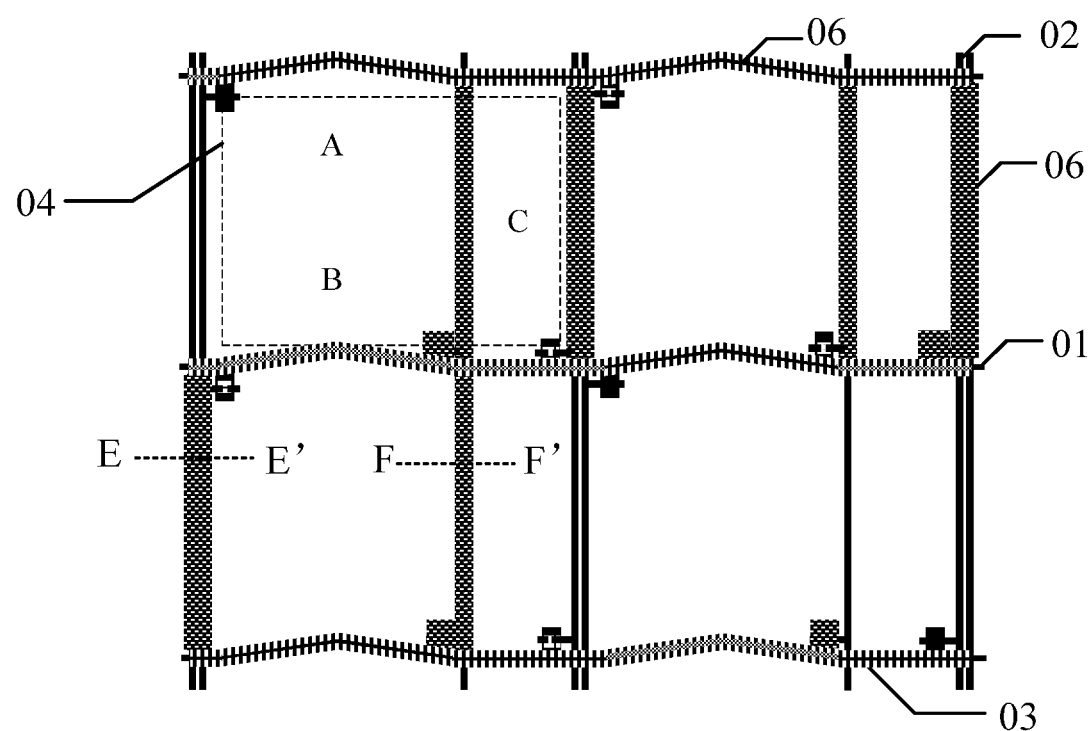
FIG. 1c is a schematic structural view of an array substrate according to yet another embodiment of the present disclosure.

For example, as shown in FIG. 1c, in each pixel unit 04, there may be one group of pixel electrodes that include two pixel electrodes arranged substantially along the extension direction of the date lines 02, such as the pixel electrode A and the pixel electrode B.

Figure 1D:
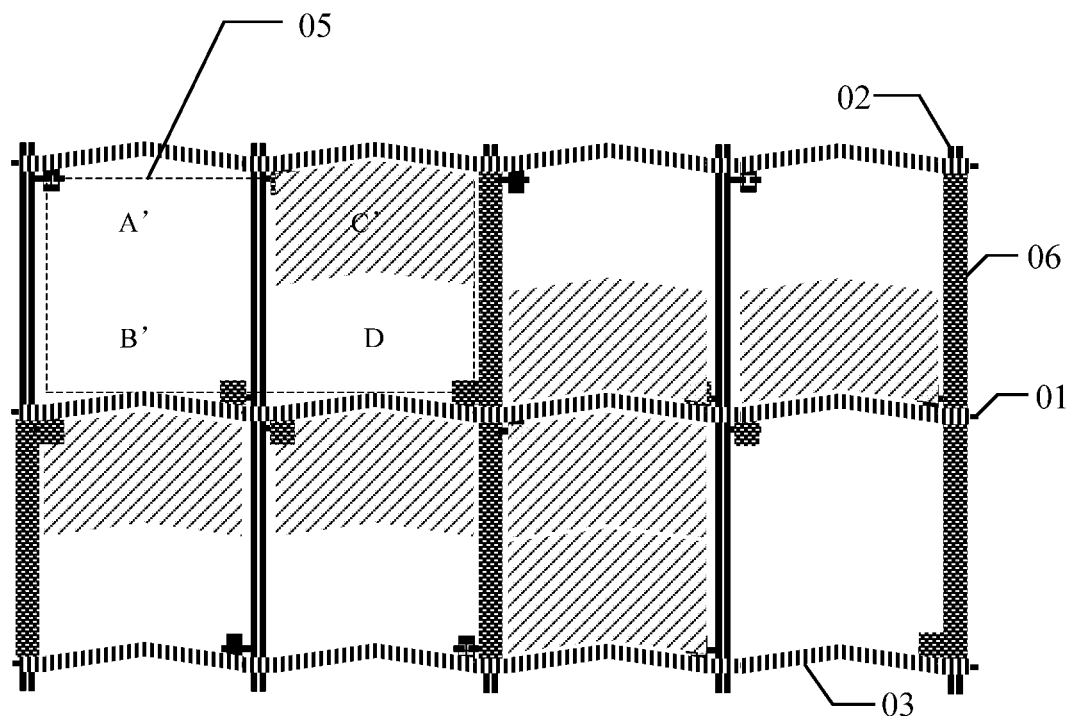
FIG. 1d is a schematic structural view of an array substrate according to further embodiment of the present disclosure.

As another example, as shown in FIG. 1d, in each pixel unit 05, there may be two groups of pixel electrodes that each include two pixel electrodes arranged substantially along the extension direction of the date lines 02, such as the pixel electrode A', the pixel electrode B', the pixel electrode C', and the pixel electrode D', which is not limited herein.

Figure 2:
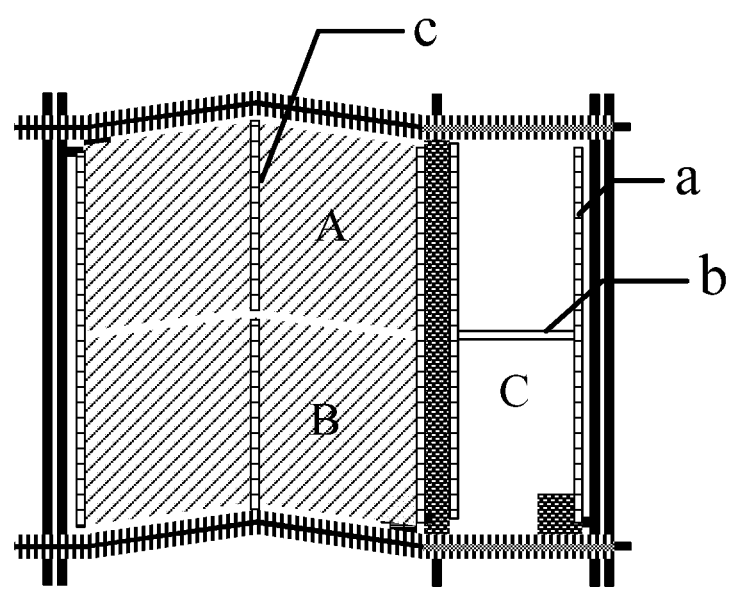
FIG. 2 is a schematic structural view of an array substrate according to an embodiment of the present disclosure, showing positions of disclinations.

Taking the structure shown in FIG. 1c as an example and using the schematic view of FIG. 2 showing the positions of disclinations corresponding to the structure of FIG. 1c, the utilization factor of liquid crystals in the structure can be calculated as below:

The disclination ratio $X_A$ of the pixel electrode A satisfies:

$$X_A = a/2 + a/2 + c.$$

The disclination ratio $X_B$ of the pixel electrode B satisfies:

$$X_B = a/2 + a/2 + c.$$

The disclination ratio $X_C$ of the pixel electrode C satisfies:

$$X_C = a + a + b.$$

Where, the characters a, b, and c refer to the disclination ratios of their respective positions, and the disclination ratio at b position is much larger than the disclination ratio at c position. From the result of the calculation, it can be known that the general disclination ratio in each pixel unit is $X_A + X_B + X_C$, since c<b, there is: $X_A = X_B < X_C$.

In contrast, in the prior art in which each pixel unit consists of three pixel electrodes C arranged horizontally or vertically, the general disclination ratio in each pixel unit is $3X_C$. Thus, as a result of comparison with the structure of the pixel unit in an array substrate according to embodiments of the present disclosure, the disclination ratio can be effectively reduced and the utilization factor of liquid crystals can be improved, and thus the transmittance of the LCD panel can be improved.

Further, in an array substrate according to an embodiment of the disclosure, as shown in FIG. 1c, the two pixel electrodes A and B arranged substantially along the extension direction of the data lines 02 each have a length substantially in an extension direction of the gate lines 01 larger than a length thereof substantially in an extension direction of the data lines 02.

Specifically, in FIG. 1c, the data lines 02 are arranged vertically on a base substrate of the array substrate, and the gate lines 01 are arranged horizontally. In each pixel unit 04, there is a group of pixel electrodes A and B arranged vertically, and the length of each of the pixel electrodes A and B in a horizontal direction is larger than the length thereof in a vertical direction.

In an array substrate according to some embodiments of the disclosure, every three pixel electrodes constitute a pixel unit having a rectangular shape, in which two of the every three pixel electrodes are arranged substantially in the extension direction of the data lines 02, the remaining one of the every three pixel electrodes is arranged substantially in the extension direction of the gate lines 01 with respect to the two of the every three pixel electrodes arranged substantially in the extension direction of the data lines 02.

For example, as shown in FIG. 1c, the pixel electrode A, the pixel electrode B and the pixel electrode C constitute a pixel unit 04 having a rectangular shape. Two pixel electrodes A and B are arranged vertically substantially in the extension direction of the data lines 02, and the length of each of the pixel electrodes A and B in a horizontal direction is larger than the length thereof in a vertical direction. The pixel electrode C is arranged on the right side of the pixel electrode A and the pixel electrode B and is arranged vertically, and the length of the pixel electrode C in a vertical direction is equal to the sum of the lengths of the pixel electrode A and the pixel electrode B in a vertical direction. That is, between two adjacent gate lines 01, there is a pixel unit 04 having a rectangular shape and including three pixel electrodes arranged in a delta type shape, and a plurality of pixel units 04 are arranged periodically on the base substrate in an array.

In an array substrate according to some other embodiments of the present disclosure, every four pixel electrodes constitute a pixel unit having a rectangular shape, in which two groups of pixel electrodes are arranged substantially in the extension direction of the gate lines 01, with each group consisting of two pixel electrodes arranged substantially in the extension direction of the date lines 02.

For example, as shown in FIG. 1d, the pixel electrode A', the pixel electrode B', the pixel electrode C' and the pixel electrode D' constitute a pixel unit 05 having a rectangular shape. The pixel electrodes A' and B' are arranged vertically and a horizontal length thereof is larger than a vertical length thereof, and the pixel electrodes C' and D' are arranged vertically and a horizontal length thereof is larger than a vertical length thereof. That is, between two adjacent gate lines 01, there is a pixel unit 05 having a rectangular shape and including four pixel electrodes arranged in a field type shape, and a plurality of pixel units 05 are arranged periodically on the base substrate in an array.

In specific implementations, in order to avoid light leakage around the gate lines 01 and the data lines 02, as shown in FIG. 1c or FIG. 1d, the array substrate may further include a black matrix layer 06 over the gate lines 01 and the data lines 02, and a width of a pattern of the black matrix layer 06 over each data line 02 and covering the data line 02 is larger than the width of the data line 02.

Specifically, because there is a shielding electrode 03 over the gate line 01, the width of the black matrix layer 06 over the gate line 01 can be set to be equal to the width of the gate line 01. A width of the black matrix layer 06 over the data line 02 within each pixel unit can be calculated by the following method.

Figure 3:
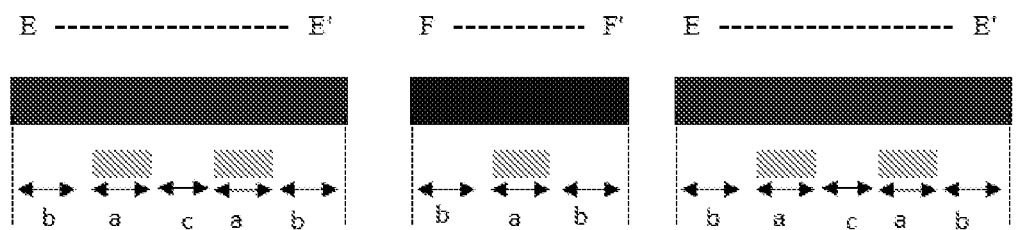
FIG. 3 is a schematic structural view of a black matrix covering data lines in an array substrate according to an embodiment of the present disclosure.

Taking the structure shown in FIG. 1c as an example and referring to the structural schematic view shown in FIG. 3 showing that the black matrix layer 06 covers the data lines 02, it can be known that the width M of the black matrix layer 06 corresponding to three data lines 02 included in one pixel unit 04 is constituted by two halves of EE' and one FF', namely, $M=c/2+a+b+b+a+b+b+a+c/2=3a+4b+c,$ where, 'a' refers to a width of the data line 02, 'b' refers to a tolerance, and 'c' refers to a space between two data lines 02, which typically is set as 6.5 um.

In contrast, in the prior art, a width N of the black matrix layer covering data lines is constituted by three FF', namely, $N=a/2+b+b+a+b+b+a+b+b+a/2=3a+6b,$ where, 'a' refers to a width of the data line, and 'b' refers to a tolerance.

Since $c/2<<b$, the width of the black matrix layer in each pixel unit of the array substrate according to embodiments of the present disclosure is much less than the width of the black matrix layer in each pixel unit of the array substrate in the prior art. Thus, the pixel aperture ratio of the array substrate according to embodiments of the present disclosure is increased.

Based on the same inventive concept, embodiments of the present disclosure also provide a liquid crystal display (LCD) panel including the array substrate according to the above embodiments of the present disclosure, an opposing substrate opposite to the array substrate, and a black matrix layer provided on a side of the opposing substrate facing the array substrate or on a side of the array substrate facing the opposing substrate, wherein a width of a pattern of the black matrix layer over the data line and covering the date line is greater than a width of the data line.

Embodiments of the present disclosure also provide a display apparatus, including the liquid crystal display (LCD) panel according to the above embodiments of the present disclosure. The display apparatus may be a mobile phone, a panel computer, a TV set, a monitor, a laptop computer, a digital photo frame, a navigator and other products or components having a display function. For the implementation of the display apparatus, it can refer to embodiments of the liquid crystal display (LCD) panel, and redundant description will be omitted.

With the array substrate, the liquid crystal display (LCD) panel and the display apparatus according to embodiments of the present application, the array substrate includes a plurality of gate lines and a plurality of data lines crossing each other, a plurality of pixel electrodes disposed within areas defined by the plurality of gate lines and the plurality of data lines, and shielding electrodes provided over the gate lines, wherein the shielding electrodes cover at least edge portions of the gate lines close to the pixel electrodes; at least every three pixel electrodes constitute a pixel unit, and at least one pixel electrode in each pixel unit has a length substantially in an extension direction of the gate lines larger than a length thereof substantially in an extension direction of the data lines; the respective pixel electrodes constitute the same pixel unit are connected with different data lines correspondingly; and there are two data lines in a gap between every two adjacent pixel units. Therefore, the area of the black matrix in each pixel unit for covering the data lines is greatly reduced and the aperture ratio is increased without reducing the number of the gate lines and the data lines by improving the structure of the data lines by providing two data lines in a gap between every two adjacent pixel units. Further, the area of the black matrix for covering the gate lines is reduced by using the gate line shielding. The two factors function together to greatly increase the aperture ratio of the display panel and thus greatly improve picture quality of the LCD panel.

Although several exemplary embodiments have been shown and described, it would be appreciated by those skilled in the art that various changes or modifications may be made in these embodiments without departing from the principles and spirit of the disclosure. If these modifications and changes are covered by the claims and their equivalents defined in the claims, they are also included in the present disclosure.

What is claimed is:

1. An array substrate comprising:
   a plurality of gate lines and a plurality of data lines arranged to cross each other;
   a plurality of pixel electrodes disposed within areas defined by the plurality of gate lines and the plurality of data lines; and
   shielding electrodes disposed above the gate lines,
   wherein the shielding electrodes cover at least edge portions of the gate lines close to the pixel electrodes, respectively,
   wherein at least every three of the plurality of pixel electrodes constitute a pixel unit, and at least one of the plurality of pixel electrodes in each pixel unit has a length in an extension direction of the gate lines larger than a length in an extension direction of the data lines,
   wherein the respective ones of the plurality of pixel electrodes constituting a same pixel unit are connected with different data lines correspondingly, and
   wherein two of the plurality of data lines are provided in a gap between every two adjacent pixel units.

2. The array substrate according to claim 1, further comprising a black matrix layer disposed over the data lines and the gate lines,
   wherein a width of a pattern of the black matrix layer over each data line and covering the data line is greater than a width of the data line.

3. The array substrate according to claim 1, wherein the shielding electrodes only cover the edge portions of the gate lines, respectively.

4. The array substrate according to claim 3, wherein the shielding electrodes and the pixel electrodes are disposed in a same layer and are insulated from each other.

5. The array substrate according to claim 1, wherein the shielding electrodes completely cover the gate lines, respectively.

6. The array substrate according to claim 5, wherein the shielding electrodes and the pixel electrodes are disposed in a same layer and are insulated from each other.

7. The array substrate according to claim 1, wherein in each pixel unit, there is at least one group of the plurality of pixel electrodes consisting of two pixel electrodes arranged in the extension direction of the data lines.

8. The array substrate according to claim 7, wherein each of the two pixel electrodes arranged in the extension direction of the data lines has a length in the extension direction of the gate lines larger than a length in the extension direction of the data lines.

9. The array substrate according to claim 8, wherein every three of the plurality of pixel electrodes constitute a pixel unit having a rectangular shape, in which two of the every three pixel electrodes are arranged in the extension direction of the data lines, while the remaining one of the every three pixel electrodes and the two of the every three pixel electrodes are arranged in the extension direction of the gate lines.

10. The array substrate according to claim 8, wherein every four of the plurality of pixel electrodes constitute a pixel unit having a rectangular shape, in which two groups of pixel electrodes are arranged substantially in the extension direction of the gate lines, with each group consisting of two pixel electrodes arranged substantially in the extension direction of the date lines.

11. A liquid crystal display panel comprising:
    the array substrate according to claim 1;
    an opposing substrate opposite to the array substrate; and
    a black matrix layer provided on a side of the opposing substrate facing the array substrate or on a side of the array substrate facing the opposing substrate;
    wherein a width of a pattern of the black matrix layer over each data line and covering the data line is greater than a width of the data line.

12. A display apparatus, comprising the liquid crystal display panel according to claim 11.

13. The liquid crystal display panel according to claim 11, wherein, in the array substrate, the shielding electrodes only cover the edge portions of the gate lines, respectively.

14. The liquid crystal display panel according to claim 13, wherein, in the array substrate, the shielding electrodes and the pixel electrodes are disposed in a same layer and are insulated from each other.

15. The liquid crystal display panel according to claim 11, wherein, in the array substrate, the shielding electrodes completely cover the gate lines, respectively.

16. The liquid crystal display panel according to claim 15, wherein, in the array substrate, the shielding electrodes and the pixel electrodes are disposed in a same layer and are insulated from each other.

17. The liquid crystal display panel according to claim 11, wherein, in each pixel unit in the array substrate, there is at least one group of pixel electrodes consisting of two pixel electrodes arranged in the extension direction of the data lines.

18. The liquid crystal display panel according to claim 17, wherein, in the array substrate, each of the two pixel electrodes arranged in the extension direction of the data lines has a length in the extension direction of the gate lines larger than a length in the extension direction of the data lines.

19. The liquid crystal display panel according to claim 18, wherein, in the array substrate, every three of the plurality of pixel electrodes constitute a pixel unit having a rectangular shape, in which two of the every three of the plurality of pixel electrodes are arranged in the extension direction of the data lines, while the remaining one of the every three of the plurality of pixel electrodes and the two of the every three of the plurality of pixel electrodes are arranged in the extension direction of the gate lines.

20. The liquid crystal display panel according to claim 18, wherein, in the array substrate, every four of the plurality of pixel electrodes constitute a pixel unit having a rectangular shape, in which two groups of pixel electrodes are arranged substantially in the extension direction of the gate lines, with each group consisting of two pixel electrodes arranged substantially in the extension direction of the date lines.

* * * * *